(12) United States Patent
Kiyose et al.

(10) Patent No.: US 6,992,536 B2
(45) Date of Patent: Jan. 31, 2006

(54) VOLTAGE-CONTROLLED OSCILLATOR

(75) Inventors: Masashi Kiyose, Gifu (JP); Takuya Shiraishi, Higashiosaka (JP)

(73) Assignee: Sanyo Electric Co., Ltd., Osaka (JP)

( * ) Notice: Subject to any disclaimer, the term of this patent is extended or adjusted under 35 U.S.C. 154(b) by 253 days.

(21) Appl. No.: 10/633,885

(22) Filed: Aug. 4, 2003

(65) Prior Publication Data

US 2004/0090276 A1 May 13, 2004

(51) Int. Cl.
*H03L 7/087* (2006.01)
*H03L 7/099* (2006.01)

(52) U.S. Cl. .................... 331/177 R; 331/8; 331/11; 331/17; 331/34; 331/57; 360/51

(58) Field of Classification Search .............. 331/1 A, 331/8, 10–12, 16–18, 25, 34, 57, 177 R; 327/156–159; 332/127; 360/51; 375/376; 455/260
See application file for complete search history.

(56) References Cited

U.S. PATENT DOCUMENTS

| | | |
|---|---|---|
| 4,511,859 A | 4/1985 | Dombrowski |
| 5,072,195 A | 12/1991 | Graham et al. |
| 5,088,080 A | 2/1992 | Ishibashi et al. |
| 5,363,419 A | 11/1994 | Ho |
| 5,933,037 A | 8/1999 | Momtaz |
| 5,982,208 A | 11/1999 | Kokubo et al. |
| 6,215,835 B1 | 4/2001 | Kyles |
| 6,222,421 B1 * | 4/2001 | Kiyose ........................ 331/17 |
| 6,812,754 B1 * | 11/2004 | Nakanishi .................... 327/157 |

* cited by examiner

*Primary Examiner*—David Mis
(74) *Attorney, Agent, or Firm*—Fish & Richardson P.C.

(57) ABSTRACT

A voltage-controlled oscillator (VCO) enabling proper gain adjustment with a simple configuration. The VCO includes a first current source for generating a first control current in accordance with the first control voltage and a second current source for generating a second control current in accordance with the second control voltage. A control voltage generation circuit synthesizes the first and second control currents to generate an oscillation control voltage in accordance with the synthesized current. A ring oscillator generates an oscillation signal with a frequency corresponding to the oscillation control voltage. The first current source varies a changing amount of the first control current relative to a change in the first control voltage. The second current source varies a changing amount of the second control current relative to a change in the second control voltage.

8 Claims, 8 Drawing Sheets

VOLTAGE-CONTROLLED OSCILLATOR

BACKGROUND OF THE INVENTION

The present invention relates to a voltage-controlled oscillator for variably controlling the frequency of an output pulse in accordance with an input voltage.

A phase locked loop (PLL) is known to be used to generate a clock signal that is synchronized with a reference pulse signal. The PLL includes a phase comparator for comparing the clock signal generated by the PLL with the reference pulse signal, a low pass filter for generating DC voltage in accordance with the comparison result of the phase comparator, and a voltage-controlled oscillator (VCO) for generating the clock signal from a control voltage, or the DC voltage from the low pass filter. In the VCO, a signal based on the difference between the frequency of the clock signal and the frequency of the reference signal is applied as the control voltage to the VCO to perform feedback control. The VCO varies the frequency of the clock signal in accordance with the control voltage. Thus, the VCO generates clock signals synchronized with various frequency signals.

The VCO, which varies its gain (the varied amount of the frequency (control current) relative to the varied amount of a predetermined control voltage) to generate the clock signal, is optimal, for example, when generating the reference clock signal with a data recording device in accordance with the rotation of the disc medium, the rotation of which is controlled. That is, when the data recording device performs 2× speed recording, the gain of the VCO is varied in accordance with the rotation velocity to generate the reference clock signal that properly corresponds to the rotation of the disc medium regardless of changes in the rotation velocity of the disc medium.

The gain control of the VCO may be performed by adding a certain control voltage to the predetermined control voltage. However, in such a case, when providing a control gain for each control voltage to the VCO gain, complicated control must be performed. Thus, the gain control is complicated when varying the VCO gain by adding two control voltages related to the rotation speed of the disc medium, in for example, a data recording device provided with a 2×speed recording function.

SUMMARY OF THE INVENTION

An aspect of the present invention is a voltage-controlled oscillator for generating an oscillation signal with a frequency corresponding to first and second control voltages. The voltage-controlled oscillator includes a first current source for generating a first control current in accordance with the first control voltage, with the first current source varying a changing amount of the first control current relative to a change in the first control voltage. A second current source generates a second control current in accordance with the second control voltage, with the second current source varying a changing amount of the second control current relative to a change in the second control voltage. A control voltage generation circuit is connected to the first and second current sources to synthesize a synthesized current from the first and second control currents and generate an oscillation control voltage in accordance with the synthesized current. A ring oscillator is connected to the control voltage generation circuit to generate the oscillation signal with a frequency corresponding to the oscillation control voltage.

A further aspect of the present invention is a voltage-controlled oscillator for generating an oscillation signal with a frequency corresponding to a plurality of control voltages. The voltage-controlled oscillator includes a plurality of current sources, each generating a control current in accordance with an associated one of the control voltages, each current source varying a changing amount of its respective control current relative to a change in the associated control voltage. A control voltage generation circuit is connected to the plurality of current sources to synthesize a synthesized current from the control currents and generate an oscillation control voltage in accordance with the synthesized current. A ring oscillator is connected to the control voltage generation circuit to generate the oscillation signal with a frequency corresponding to the oscillation control voltage.

A further aspect of the present invention is a method for controlling a voltage-controlled oscillator that generates an oscillation signal with a frequency corresponding to first and second control voltages. The method includes generating a first control current in accordance with the first control voltage by supplying the voltage-controlled oscillator with the first control voltage, varying a changing amount of the first control current relative to a change in the first control voltage, generating a second control current in accordance with the second control voltage by supplying the voltage-controlled oscillator with the second control voltage, varying a changing amount of the second control current relative to a change in the second control voltage, synthesizing a synthesized current from the first and second control currents to generate an oscillation control voltage in accordance with the synthesized current, and generating the oscillation signal with a frequency corresponding to the oscillation control voltage.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
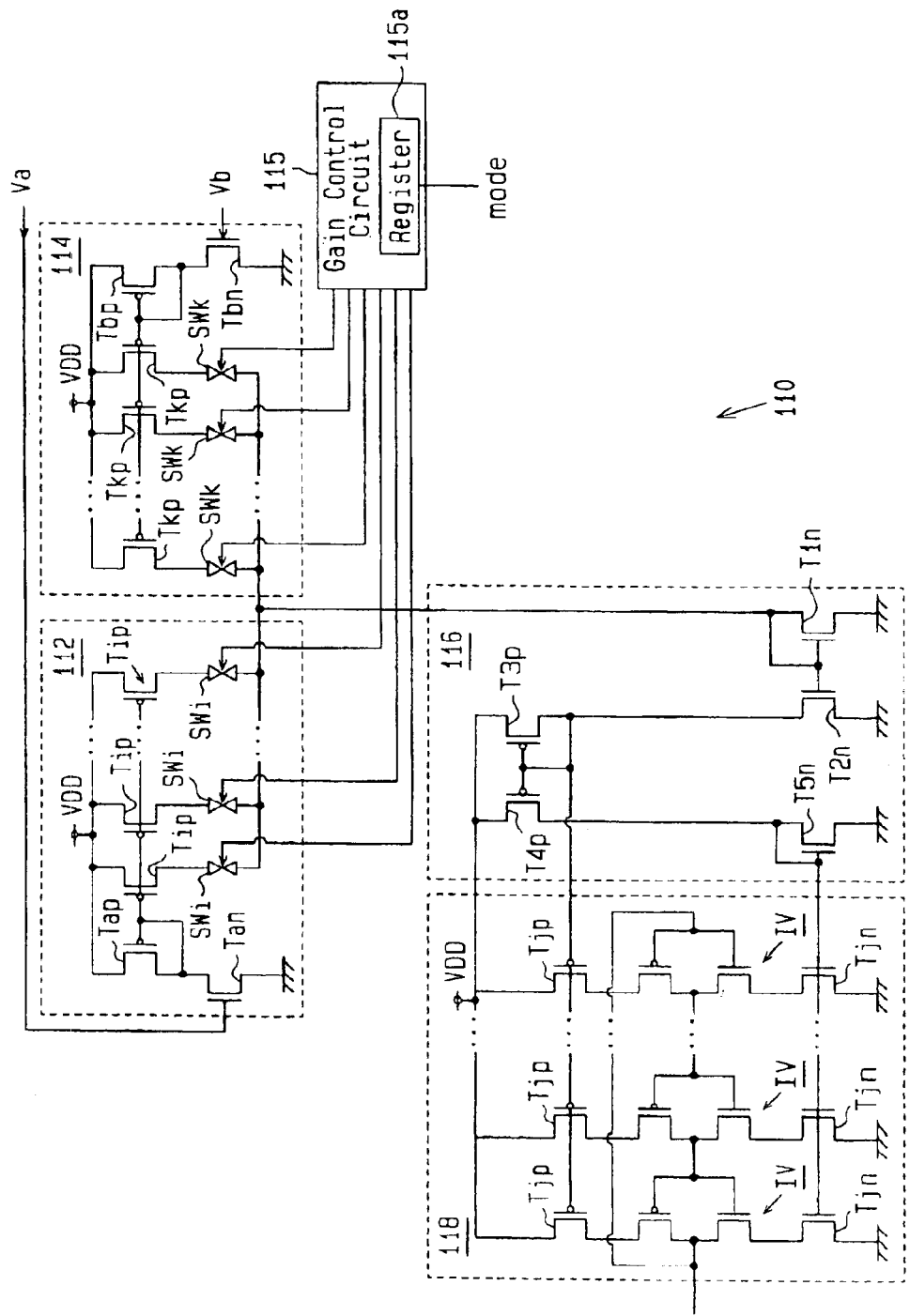
FIG. 1 is a schematic block diagram of a voltage-controlled oscillator according to a preferred embodiment of the present invention.

In the drawings, like numerals are used for like elements throughout.

FIG. 1 is a schematic block diagram of a voltage-controlled oscillator (VCO) according to a preferred embodiment of the present invention. The VCO 110 is used in a clock generator 100 of a data recording controller 200. The data recording controller 200 will now be discussed.

Figure 6:
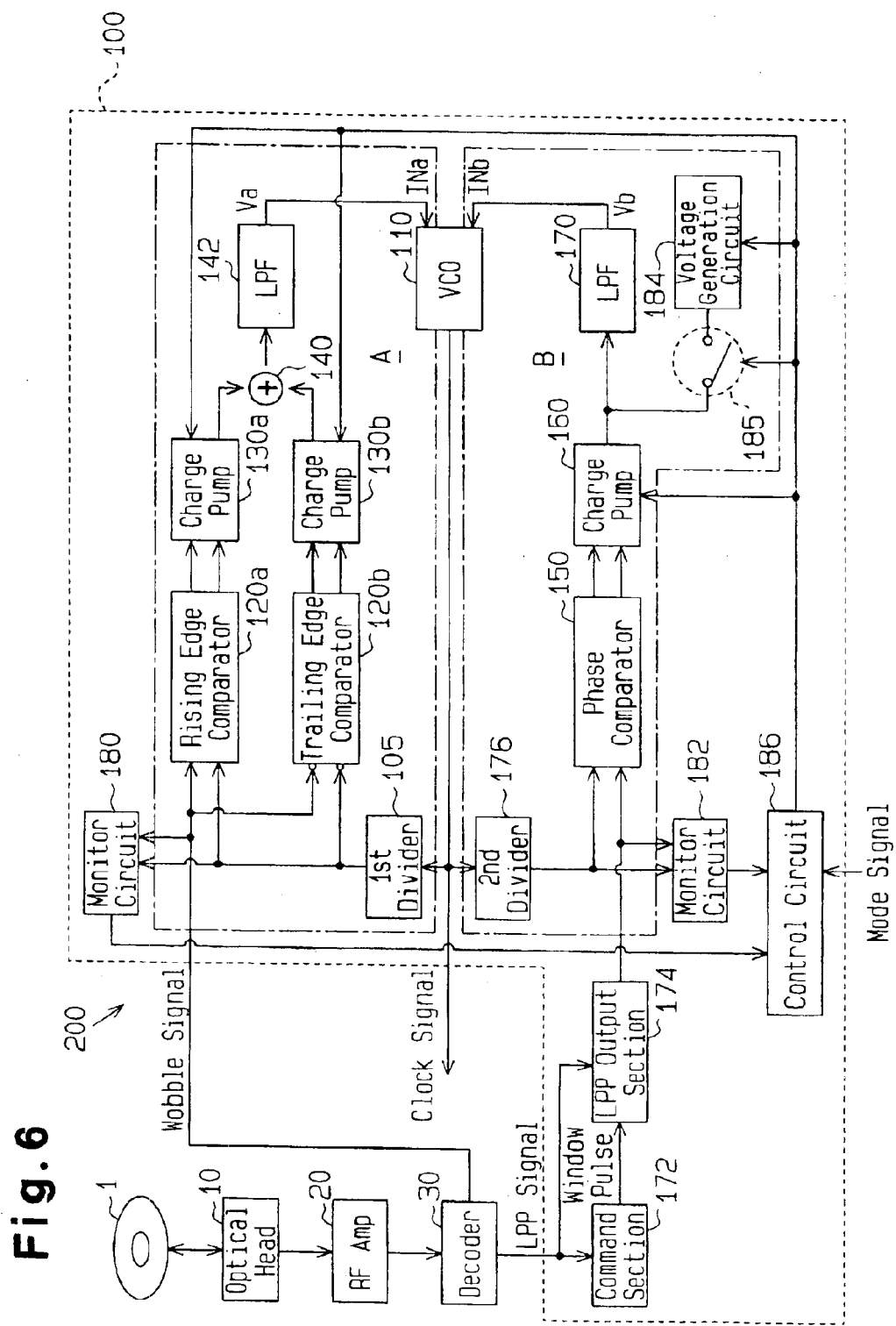
FIG. 6 is a schematic circuit diagram of a data recording controller that includes the voltage-controlled oscillator of FIG. 1.

FIG. 6 is a schematic block diagram of the data recording controller 200. The data recording controller 200 is employed as a DVD-R data recording controller.

An optical disc 1, which is a disc medium, is the recording subject of the data recording controller 200. The optical disc 1 is, for example, a data writeable (recordable) DVD-R disc. A pregroove, which functions as a guide groove of the optical disc 1, extends spirally in the disc 1. Land prepits (LPPs) are formed near the pregrooves.

The pregroove extends in a wobbled manner along the optical disc 1. A signal including a wobble component has a frequency of 140.6 kHz. The LPPs are formed at predetermined intervals along the optical disc 1. The interval is set so that a signal having one pulse per about sixteen pulses of the wobble signal may be obtained. An LPP signal is generated by reproducing the LPPs.

The data recording controller 200 includes an optical head 10, an RF amplifier 20, a decoder 30, and a clock generator 100. The optical head 10 emits a laser beam onto the optical disc 1 and receives the reflection of the laser beam from the optical disc 1. The RF amplifier 20 generates a binary digital signal from the reflection received by the optical head 10. The decoder 30 decodes the digital signal and generates the wobble signal and the LPP signal.

The clock generator 100 generates a clock signal, which is used by the data recording controller 200, in accordance with the wobble signal and the LPP signal. More specifically, the clock generator 100 generates the clock signal with a frequency that is 5952 times greater than the frequency of the LPP signal. In other words, the clock signal has 5952 pulses between two LPP signal pulses. The clock signal has a frequency of 52.32 MHz.

After synchronizing the frequency of the clock signal with the frequency of the wobble signal, the clock generator 100 synchronizes the phase of the clock signal with the phase of the LPP signal. More specifically, after the difference between the frequencies of the wobble signal and the clock signal converges to within a predetermined range, the clock generator 100 phase-controls the clock signal in accordance with the LPP signal. This is because the generation of the clock signal in synchronization with the LPP signal is difficult since the frequency of the LPP signal is lower than the frequency of the wobble signal and the LPPs formed in the disc medium may be lost when data is recorded. In the preferred embodiment, the clock signal is roughly adjusted in accordance with the wobble signal. Then, the roughly adjusted clock signal is finely adjusted in accordance with the LPP signal to generate the clock signal with its phase synchronized to that of the LPP signal.

The clock generator 100 includes two phase-locked loops (PLLs), as shown in FIG. 6. One of the two loops is a first loop A and the other is a second loop B. The first loop A synchronizes the frequency of a first divisional clock signal, which is generated by a first divider 105, with the frequency of the wobble signal. The second loop B synchronizes the phase of a second divisional clock signal, which is generated by a second divider 176, with the phase of the LPP signal. The first loop A and the second loop B share the same voltage-controlled oscillator (VCO) 110. The VCO 110 has a first control voltage input terminal INa and a second control voltage input terminal INb. The first control voltage input terminal INa is supplied with a first control voltage corresponding to the difference between the frequency of the first divisional clock signal and the frequency of the wobble signal. The second control voltage input terminal INb is supplied with a second control voltage corresponding to the difference between the phase of the second divisional clock signal and the phase of the LPP signal.

The VCO 110, which is shared by the first loop A and the second loop B, will now be discussed. FIG. 1 is a schematic circuit diagram of the VCO 110.

As shown in FIG. 1, the VCO 110 includes a first current source 112, a second current source 114, a gain control circuit 115, a control voltage generation circuit 116, and a ring oscillator 118.

The first current source 112 adjusts the gain to drive the ring oscillator 118 with a control current (first control current) corresponding to the first control voltage Va input from the first control voltage input terminal INa. More specifically, the first current source 112 includes a plurality of first output current channels, each of which is configured by a p-channel transistor Tip, and a plurality of switches SWi, each of which are connected in series to an associated one of the output current channels. The series-connected p-channel transistors Tip and switches SWi are connected in parallel between the power supply VDD and the output of the first current source 112. In accordance with the gain control circuit 115, the switches SWi connect and disconnect the power supply VDD and the output. The gain control circuit 115 sets the number of stages of the first output current channels to be used, which are connected in parallel to each other.

Further, the first current source 112 includes an input current circuit configured by an n-channel transistor Tan and a p-channel transistor Tap, which are connected in series between the power supply VDD and the ground. The amount of current that flows through the p-channel transistor Tap and the voltage at the gate of the transistor Tap are determined in accordance with the level of the first control voltage Va, which is applied to the gate of the n-channel transistor Tan. Voltage that is equal to the gate voltage of the transistor Tap is applied to the gate of each p-channel transistor Tip, which is current mirror connected to the p-channel transistor Tap. This determines the amount of current flowing between the source and drain of each p-channel transistor Tip. Accordingly, the amount of current output from the first current source 112 is controlled in accordance with the level of the first control voltage.

The second current source 114 has the same configuration as that of the first current source 112, as shown in FIG. 1. That is, the second current source 114 includes a plurality of second output current channels (p-channel transistors Tkp), a plurality of switches SWk, and a second input current source (n-channel transistor Tbn and p-channel transistor Tbp). The second current source 114 adjusts the gain to drive the ring oscillator 118 with a control current (second control current) corresponding to the second control voltage Vb input from the second control voltage input terminal INb. This controls the amount of current output from the second current source 114 in accordance with the level of the second control voltage Vb.

The gain control circuit 115 controls the first current source 112 and the second current source 114 in accordance with the mode data stored in a register 115a. That is, the gain control circuit 115 selectively opens and closes the switches SWi of the first current source 112 and the switches SWk of the second current source 114 to adjust the fluctuation rate of the output current (first and second control currents) of the first and second current sources 112 and 114 in accordance with fluctuations in the first and second control voltages.

The control voltage generation circuit 116 converts the first and second control currents supplied from the current sources 112 and 114 to voltage (oscillation control voltage). The control voltage generation circuit 116 includes two stages of current mirror circuits, which are configured by n-channel transistors T1n and T2n and p-channel transistors T3p and T4p. The gate bias voltage of an n-channel transistor T5n, which is series-connected to the p-channel transistor T4p of the second stage current mirror circuit, is supplied to the ring oscillator 118.

The ring oscillator 118 includes an odd number of inverters IV connected between the power supply VDD and the ground. The amount of current supplied to each of the inverters IV is controlled in accordance with the first and second control voltages. More specifically, a p-channel transistor Tjp is connected between the power supply VDD and each inverter IV. Further, an n-channel transistor Tjn is connected between each inverter IV and the ground. The voltage corresponding to the first and second control currents of the first and second current sources 112 and 114 is applied to the transistors Tjp and Tjn, which control the amount of current flowing through the inverters IV, via the control voltage generation circuit 116.

Figure 2:
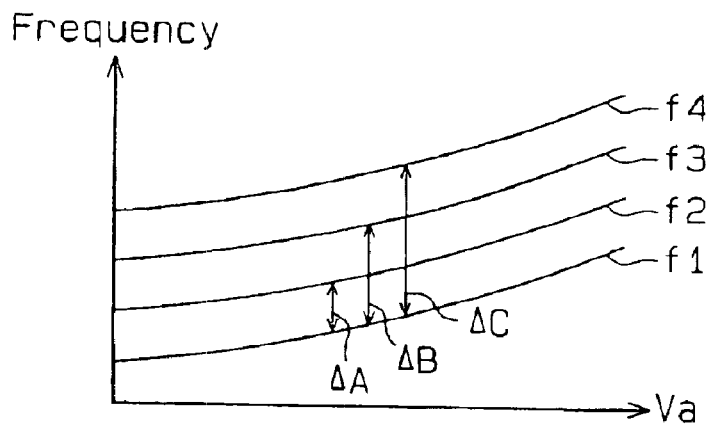
FIGS. 2 to 5 are graphs illustrating the characteristics of the voltage-controlled oscillator of FIG. 1.

The characteristics of the VCO 110 will now be discussed. FIG. 2 is a graph illustrating the relationship between the first control voltage Va applied to the first control voltage input terminal INa and the oscillation frequency of the VCO 110. In FIG. 2, curve f1 is obtained when the second control voltage applied to the control voltage input terminal INb is zero. As apparent from FIG. 2, the oscillation frequency increases as the first control voltage Va increases.

Figure 3:
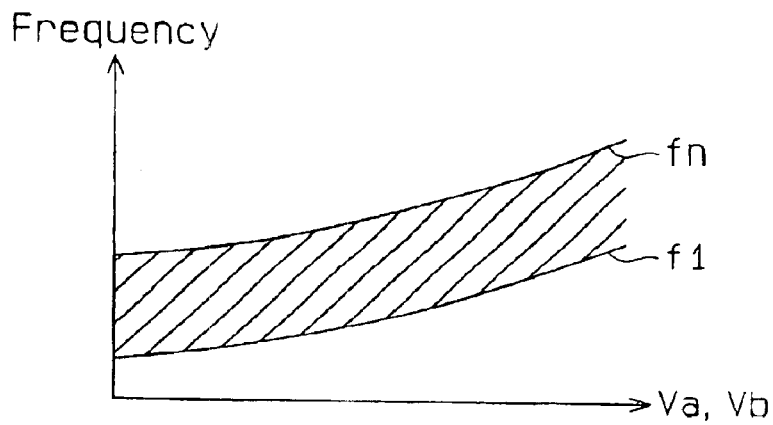

Curves f2 to f4 are obtained when applying the voltage of the power supply VDD to the second control voltage input terminal INb. The number of stages in the second output current channel of the second current source 114 is one, two, and three for the curves f2, f3, and f4, respectively. As shown in FIG. 3, when the first control voltage is constant, the oscillation frequency increases as the number of stages of the second output current channels used in the second current source 114 increases.

When the first control voltage is constant and the second control voltage applied to the second control voltage input terminal INb is variable, the bandwidth of the oscillation frequency increases as the number of stages of the second output current channels increases (ΔA<ΔB<ΔC).

The slanted lines in FIG. 3 show the oscillation frequency bandwidth of the VCO 110 when the stages of the second output current channels are fixed to a predetermined number "n" and the first and second control voltages are variable.

Figure 4:
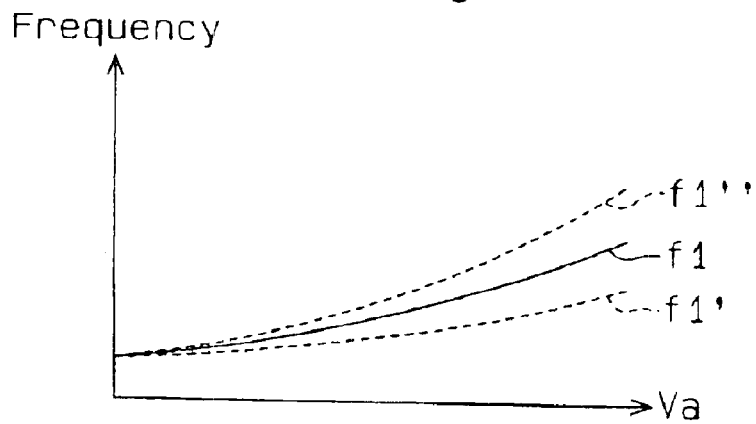

FIG. 4 shows the relationship of the first control voltage Va and the oscillation frequency when the second control voltage Vb is zero and the number of stages of the first output current channels in the first current source 112 is changed. The number of stages of the first output current channels in the first current source 112 increases in the order of curve f1', curve f1, and curve f1". As shown in FIG. 4, the increase rate of the oscillation frequency relative to the change in the first control voltage increases as the number of stages of the output current channels in the first current source 112 increases.

The characteristics schematically shown in FIGS. 2 to 4 are also obtained when the first control voltage input terminal INa is reversed with the second control voltage input terminal INb.

Figure 5:
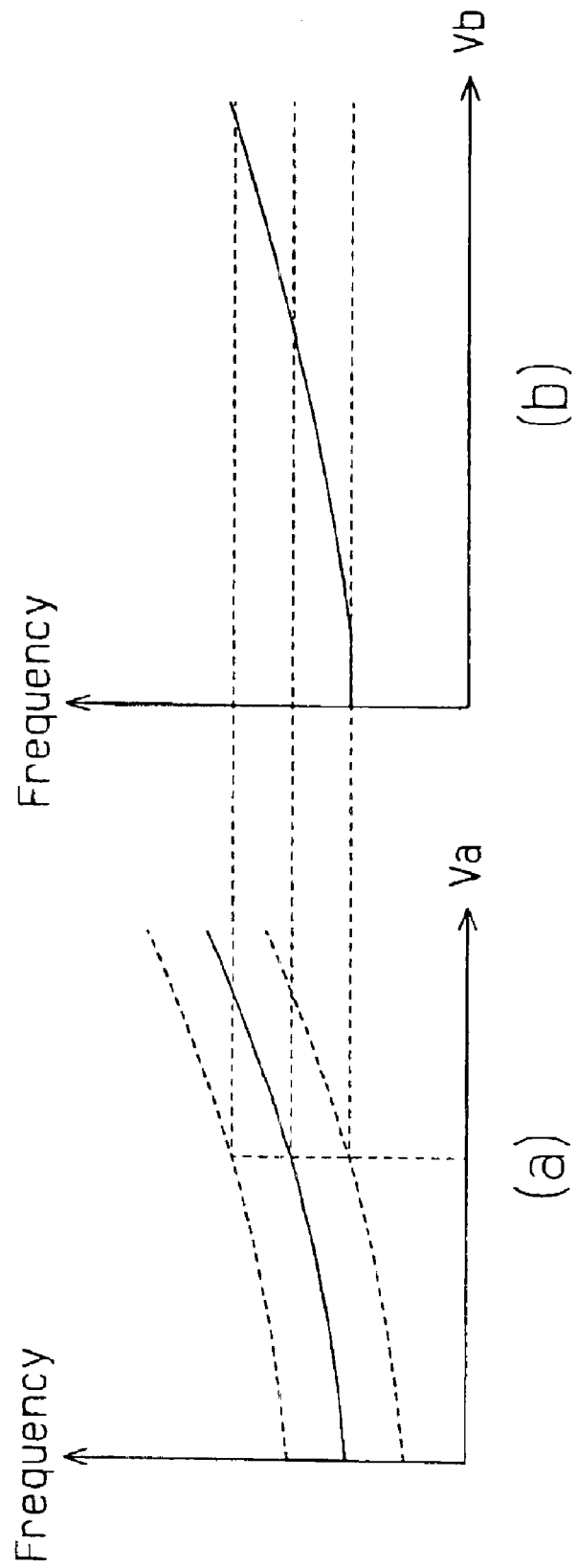

In the VCO 110, which has the two control voltage input terminals INa and INb, the output voltage of a low pass filter 142 (first control voltage Va) is applied to the first control voltage input terminal INa, and the output voltage of a low pass filter 170 (second control voltage Vb) is applied to the second control voltage INb. This synchronizes the frequency of the clock signal (more accurately, the first divisional clock signal), which is generated by the VCO 110, and the frequency of the wobble signal with the first control voltage input terminal INa, and the phase of the clock signal (more accurately, the second divisional clock signal) and the phase of the LPP signal with the second control voltage input terminal INb. In other words, the first control voltage Va roughly adjusts the oscillation frequency of the VCO 110 as shown in FIG. 5(a), and the second control voltage Vb finely adjusts the oscillation frequency as shown in FIG. 5(b).

The rough adjustment of the oscillation frequency of the VCO 110 with the first loop A and the fine adjustment of the oscillation frequency with the second loop B of the VCO 110 will now be discussed. The first loop A compares the rising edges and trailing edges of the first divisional clock signal and the wobble signal and controls the VCO 110 in accordance with the comparison result. The rising and trailing edges are both used for the reasons described below.

Figure 7:
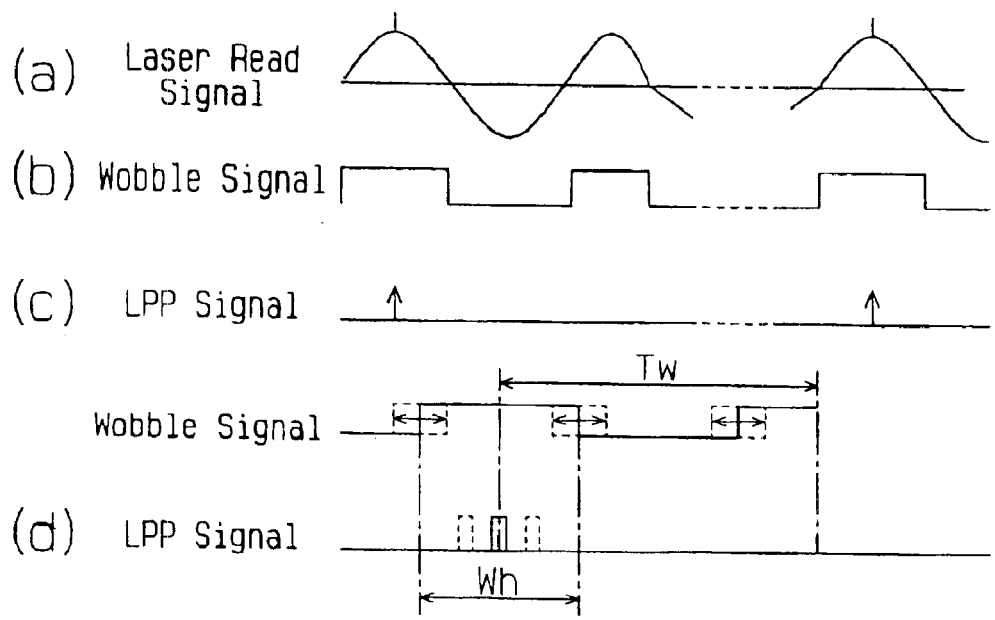
FIG. 7 is a time chart illustrating the characteristics of a wobble signal and an LPP signal.

The RF amp 20 generates the binary wobble signal shown in FIG. 7(b) from the signal of FIG. 7(a), which corresponds to the wobble of the disc medium and which is read by the laser beam. The duty ratio of the wobble signal fluctuates. Thus, when controlling the VCO 110 in accordance with the difference between the phases of the divisional clock signal and the wobble signal, the control of the VCO 110 may be affected by the fluctuations of the duty ratio.

However, the cycle Tw between the centers of pulses and the phase of the wobble signal remain constant even when the pulse width Wh changes, as shown in FIG. 7(d). Accordingly, the VCO 110 is controlled in accordance with the phase and the cycle Tw between pulse centers of the wobble signal and in accordance with the phase and the cycle between pulse centers of the divisional clock signals. This prevents the control of the VCO 110 from being affected by changes in the duty ratio.

More specifically, the first loop A of FIG. 6 includes a rising edge comparator 120a and a trailing edge comparator 120b to compare the rising edges and trailing edges of the wobble signal and the first divisional clock signal. A signal generated in accordance with the comparison result is provided from each of the comparators 120a and 120b to an associated one of charge pumps 130a and 130b and converted to a predetermined charge pump output signal. The two charge pump signals are synthesized by an adder 140, smoothed by the low pass filter 142, and then applied as the first control voltage Va to the first control voltage input terminal INa of the VCO 110. The first divider 105 divides the clock signal, which is controlled by the first control voltage Va, and provides the divided signal to the rising edge comparator 120a and the trailing edge comparator 120b. The first divisional clock signal is controlled so that its frequency is synchronized with the frequency of the wobble signal. The dividing ratio of the first divisional clock signal is 1/372. Thus, the output signal of the VCO 110 is controlled at 52.32 MHz.

Figure 8:
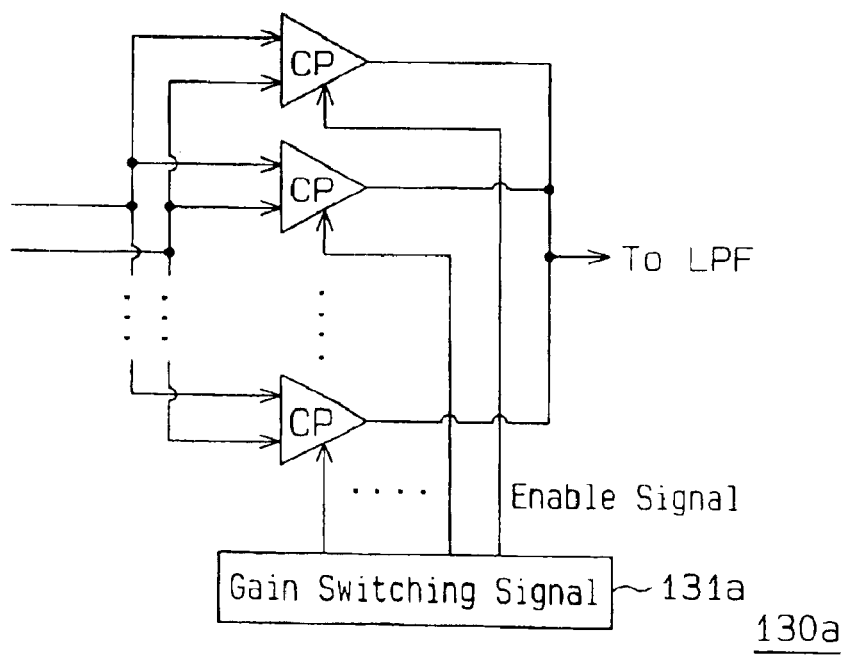
FIG. 8 is a schematic diagram of a charge pump in the data recording controller of FIG. 6.

Referring to FIG. 8, the gain of the charge pump 130a is variable. The charge pump 130a includes a plurality of charge pump units CP, which output current corresponding to the output signal of the rising edge comparator 120a, and a gain switching circuit 131a, which drives selectively some of the charge pump units CP. The gain switching circuit 131a switches the number of stages of the driven charge pump units CP to switch the gain of the charge pump 130a, or the amount of current output from the charge pump 130a relative to the phase comparison output.

Figure 9:
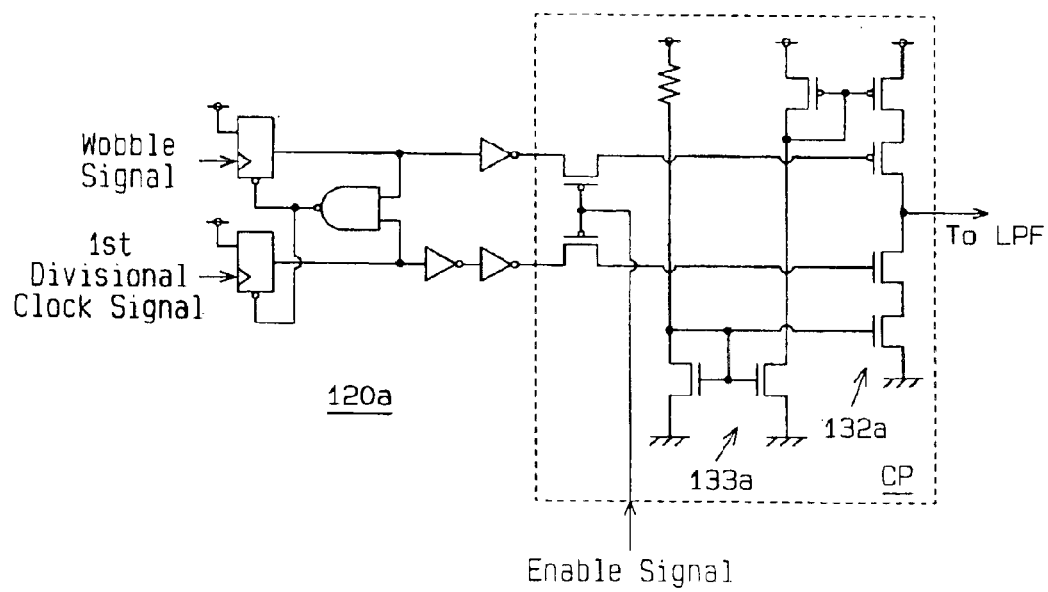
FIG. 9 is a schematic circuit diagram of a rising edge comparator and a charge pump unit in the data recording controller of FIG. 6.

FIG. 9 is a schematic circuit diagram of the rising edge comparator 120a and one of the charge pump units CP. As shown in FIG. 9, the charge pump unit CP includes an output section 132a, which outputs a signal corresponding to a comparison output signal from the rising edge comparator 120a, and a bias circuit 133a, which adjusts the output of the output section 132a.

When the rising edge of the wobble signal is earlier than the rising edge of the first divisional clock signal, the output section 132a generates a high potential signal (charge operation) from when the wobble signal goes high to when the divisional clock signal goes high. Further, when the rising edge of the first divisional clock signal is earlier than the rising edge of the wobble signal, the output section 132a generates a low potential signal (discharge operation) from when the first divisional signal goes high to when the wobble signal goes high.

In the charge pump 130a, the charge current and discharge current are set to be equal to each other when the period of the charge operation and the period of the discharge operation are the same.

The rising edge comparator 120a generates a predetermined output signal with the charge pump 130a from when one of the wobble signal and the first divisional clock signal goes high to when the other one of these signals goes high. The wobble signal and the first divisional clock signal are provided to different flip-flops (F/F). Each flip-flop outputs a high signal in synchronism with the rising edge of the provided pulse. When the pulses provided to the two flip-flops both go high, the two flip-flops are reset to interrupt the output of the signal from the charge pump 130a.

The trailing edge comparator 120b and the charge pump 130b of FIG. 6 are configured in the same manner as the rising edge comparator 120a and the charge pump 130a. Referring to FIG. 6, the signal input to the rising edge comparator 120a is inverted by an inverter and input to the trailing edge comparator 120b.

Figure 10:
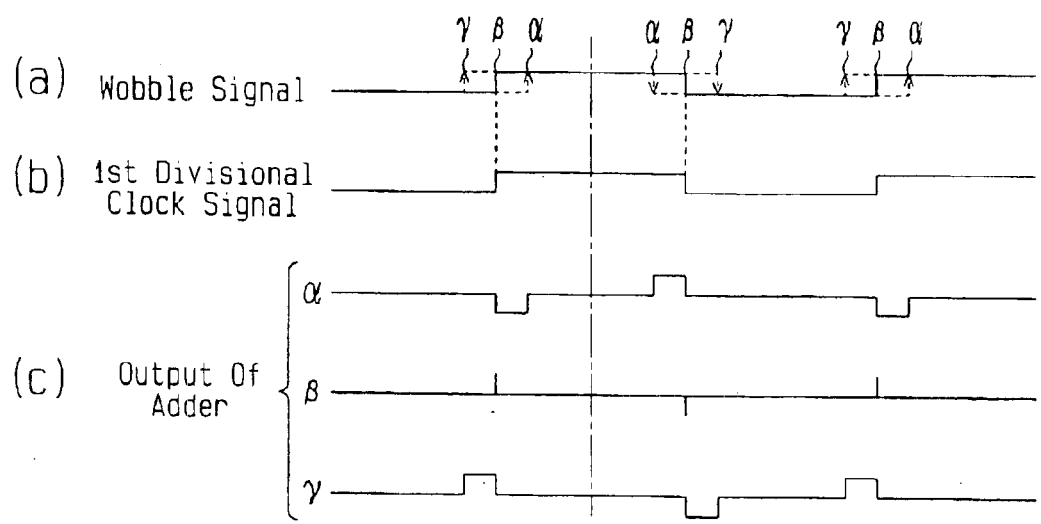
FIG. 10 is a time chart illustrating the characteristic of a clock signal, the frequency of which is synchronized with the wobble signal.

FIG. 10 shows the relationship between the signal input to the rising edge comparator 120a and the trailing edge comparator 120b and the output of the adder 140. As shown in FIG. 10(b), when the timing of the rising edge and trailing edge of the first divisional clock signal is the same as the timing of the rising edge and trailing edge of the wobble signal (as indicated by β in FIG. 10(a)), the output of the adder 140 is substantially zero.

In comparison, when the pulse width of the wobble signal (as indicated by α in FIG. 10(a)) is smaller than the pulse width of the first divisional clock signal, the adder 140 generates a low potential signal (performs the discharge operation as indicated by α in FIG. 10(c)) from when the first divisional clock signal goes high to when the wobble signal goes high. During the period from when the wobble signal goes low to when the first divisional clock signal goes low, the adder 140 generates a high potential signal (performs the charge operation as indicated by α in FIG. 10(c)). The period from when the first divisional clock signal goes high to when the wobble signal goes high is equal to the period from when the wobble signal goes low to when the first divisional clock signal goes low. Thus, the discharge current and the charge current are equal to each other.

When the pulse width of the wobble signal is greater than the pulse width of the first divisional clock signal (as indicated by γ in FIG. 10(a)), the adder 140 generates a high potential signal (performs the charge operation as indicated by γ in FIG. 10(c)) from when the wobble signal goes high to when the first divisional clock signal goes high. During the period from when the first divisional clock signal goes low to when the wobble signal goes low, the adder 140 generates a low potential signal (performs the discharge operation as indicated by γ in FIG. 10(c)). The period from when the wobble signal goes high to when the first divisional clock signal goes high is equal to the period from when the first divisional clock signal goes low to when the wobble signal goes low. Thus, the charge current and the discharge current are equal to each other.

When the pulse center of the first divisional clock signal and the wobble signal are equal, the charge current is equal to the discharge current in the charge pumps 130a and 130b. Accordingly, the pulse centers of the wobble signal and the first divisional clock signal are coincided with each other regardless of differences in the pulse widths of the wobble signal and the first divisional clock signal.

The second loop B of FIG. 6 will now be discussed. The second loop B predicts the period in which the LPP signal is detected to distinguish the LPP signal, which is provided to the clock generator 100 from the decoder 30, from noise. A command section 172 stores the time the LPP signal was first detected when starting the recording of data and counts, for example, clock pulses to calculate the period from when the LPP signal is detected to when the next LPP signal is detected. The command section 172 generates a window pulse at predetermined cycles in synchronism with the timing at which the LPP signal is likely to be detected. The pulse width of the window pulse covers the period during which there is a possibility that the LPP signal may be detected. If the LPP signal is detected when the window pulse is being provided, an LPP output section 174 outputs the LPP signal. This prevents noise from being erroneously detected as the LPP signal.

A phase comparator 150 compares the phase of the LPP signal with the phase of the second divisional clock signal, which is generated by dividing the clock signal with the second divider 176. The phase comparator 150 generates a comparison signal in accordance with the comparison result. A charge pump 160 converts the comparison signal so that it has a predetermined output level and provides the converted signal to a low pass filter 170. The low pass filter 170 smoothes the comparison signal and generates the second control voltage Vb, which is provided to the second control voltage input terminal INb of the VCO 110.

The dividing ratio of the second divider 176 is 1/5952. The second divider 176 generates the second divisional clock signal, which is offset from the LPP signal by a predetermined phase. The phase comparator 150 generates the comparison signal only when receiving the LPP signal from the LPP output section 174. This controls the frequency of the clock signal to be 52.32 MHz.

Figure 11:
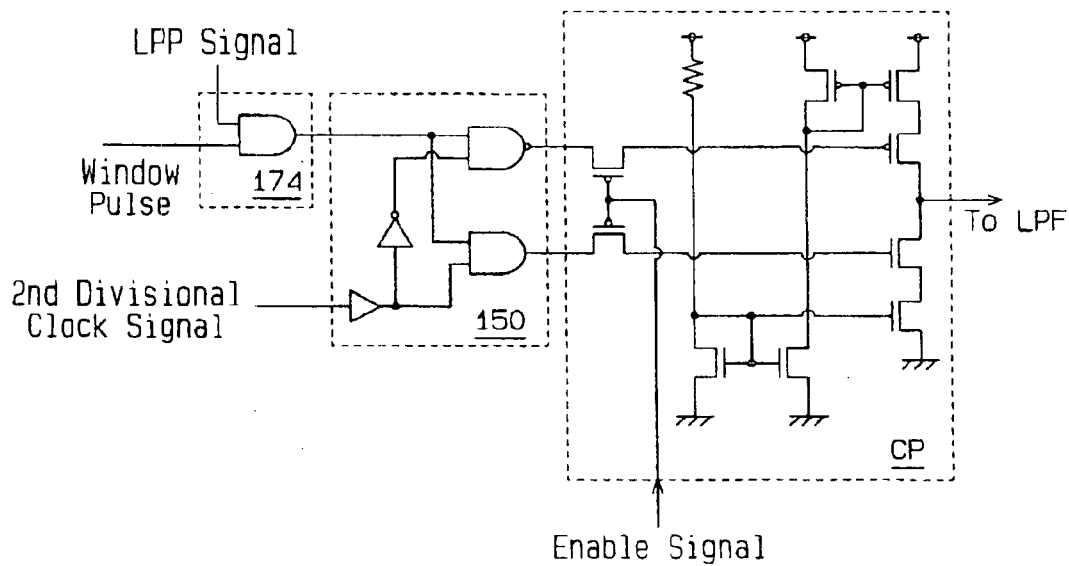
FIG. 11 is a schematic circuit diagram of a phase comparator and a charge pump unit in the data recording controller of FIG. 6.

The comparison between the LPP signal and the second divisional clock signal, or the rising edge of the second divisional clock signal provided to the phase comparator 150 is controlled so that it coincides with the pulse center of the LPP signal. To perform such control, the LPP output section 174 and the phase comparator 150 may be configured as shown in FIG. 11. A charge pump unit CP, which is connected to the output side of the phase comparator 150, is arranged in the charge pump 160. The charge pump 160 is configured in the same manner as the charge pump 130*a* of FIG. 8.

Figure 12:
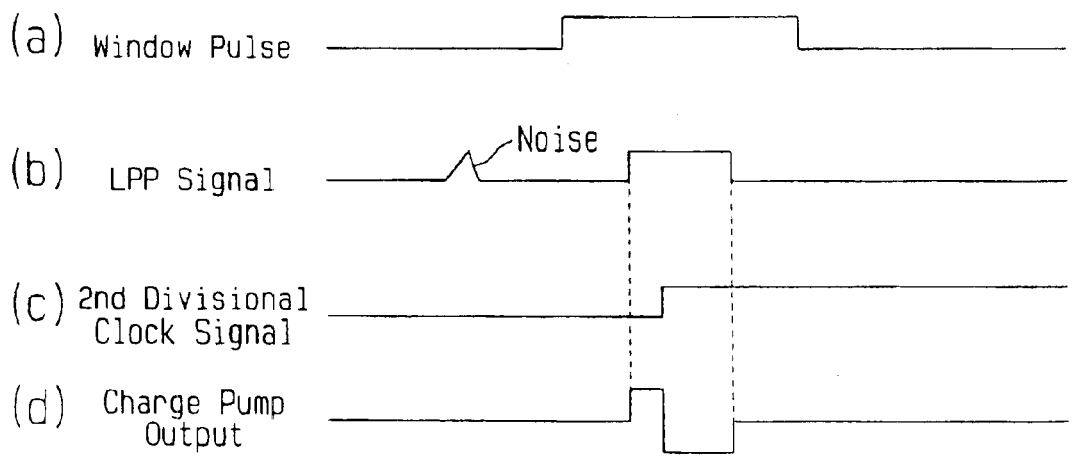
FIG. 12 is a time chart illustrating the characteristic of the clock signal, the phase of which is synchronized with the LPP signal.

FIG. 12 shows the relationship between the window pulse, the LPP signal, the second divisional clock signal, and the output of the charge pump 160. When the window pulse is not provided to the LPP output section 174, noise is not provided to the phase comparator 150 even when noise is mixed in with the LPP signal (refer to FIGS. 12(*a*) and 12(*b*)). If the LPP signal is provided to the LPP output section 174 when the window pulse is provided to the LPP output section 174 (refer to FIGS. 12(*a*) and 12(*b*)), the LPP signal is provided to the phase comparator 150. As a result, the charge pump 160 generates a high potential signal from when the LPP signal is provided to the phase comparator 150 to when the second divisional clock signal goes high. If the second divisional clock signal goes high when the LPP signal is being provided, the charge pump 160 generates a low potential signal (refer to FIGS. 12(*c*) and 12(*d*)).

When the charge operation time and discharge operation time are the same, the charge pump 160 equalizes the charge current and the discharge current. Thus, when the rising edge of the second divisional clock signal is located at the pulse center of the LPP signal, the charge current and the discharge current are equalized. In such manner, the VCO 110 is controlled so that the rising edge of the second divisional clock signal coincides with the pulse center of the LPP signal in accordance with the output signal of the charge pump 160.

The fine adjustment with the second loop B synchronizes the frequency of the clock signal with the frequency of the wobble signal and the phase of the clock signal with the phase of the LPP signal. Thus, even if the center of the LPP signal is not coincided with the center of the wobble signal as shown by the broken lines in FIG. 7(*d*), the phase of the clock signal is synchronized with the phase of the LPP signal.

A circuit for performing the two processes of rough adjustment and fine adjustment to synchronize the frequency of the clock signal with the frequency of the wobble signal and then synchronize the phase of the clock signal with the phase of the LPP signal will now be discussed.

Referring to FIG. 6, to perform the rough and fine adjustments, the clock generator 100 includes a first monitor circuit 180, a second monitor circuit 182, a voltage generation circuit 184, and a control circuit 186.

The first monitor circuit 180 retrieves the wobble signal and the first divisional clock signal to monitor whether the frequency synchronization of the wobble signal and the first divisional clock signal in the first loop A has been completed. The second monitor circuit 182 retrieves the LPP signal and the second divisional clock signal and monitors the state of the LPP signal and the second divisional clock in the second loop B.

Figure 13:
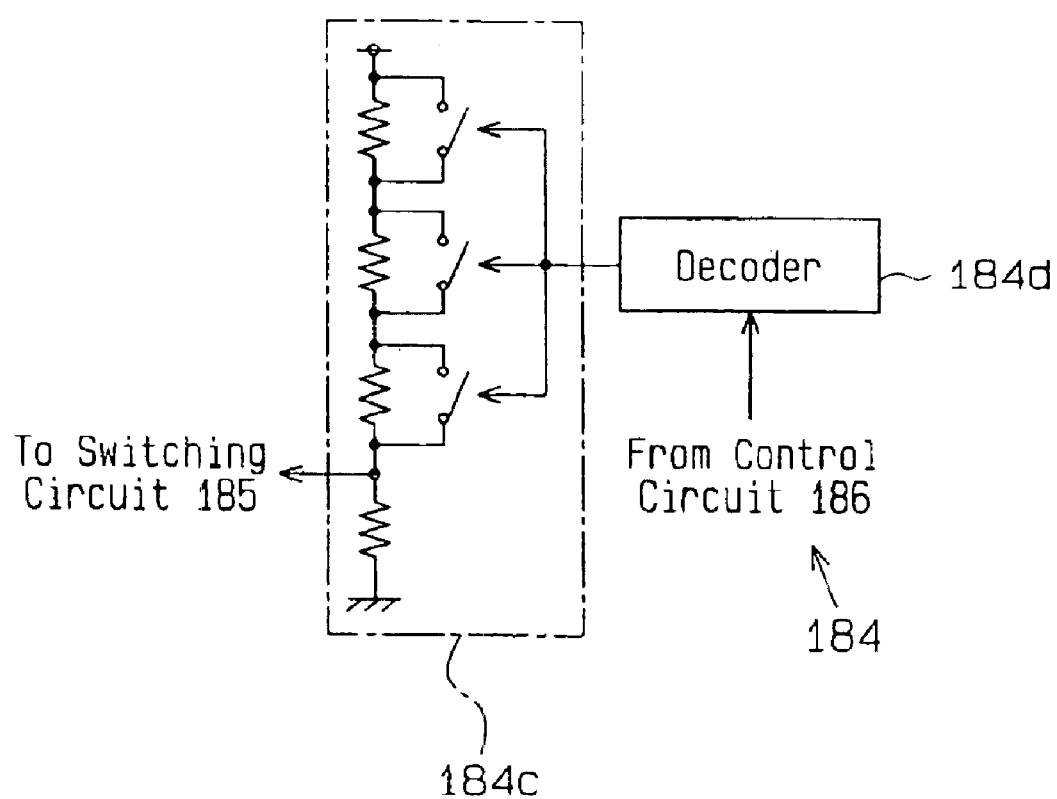
FIG. 13 is a schematic circuit diagram of a voltage generation circuit in the data recording controller of FIG. 6.

Referring to FIG. 13, the voltage generation circuit 184, which includes a voltage generation section 184*c* and a decoder 184*d*, generates a predetermined DC voltage. The voltage generation section 184*c* generates a plurality of different voltages. The decoder 184*d* decodes a command signal, which is provided from the control circuit 186, and selectively switches the value of the voltage generated by the voltage generation section 184*c*. Referring to FIG. 6, a switching circuit 185 selectively supplies a predetermined DC voltage to the low pass filter 170.

In accordance with a mode signal provided from an external device, the control circuit 186 controls the charge pumps 130*a*, 130*b*, and 160, the voltage generation circuit 184, and the switching circuit 185. The mode signal designates the speed for recording data. In the data recording controller 200, for example, a microcomputer, which controls the entire device, generates the mode signal.

The rough adjustment of the clock signal with the first loop A and the fine adjustment of the clock signal with the second loop B that are controlled by the control circuit 186 will now be discussed.

The microcomputer first provides the control circuit 186 with the mode signal to write mode data to the register 115*a* in the gain control circuit 115 of FIG. 2. In accordance with the mode data, the VCO 110 sets the current sources 112 and 114 so that the gain optimally corresponds to the data recording speed (linear velocity related to rotation of the optical disc 1). In other words, the VCO 110 sets the current sources 112 and 114 to obtain the gain (drive capacity) that is optimal for controlling the oscillation frequency in correspondence with the data recording speed. During gain adjustment, it is preferred that the gain be increased as the data recording speed increases.

The control circuit 186 sets the drive capacities of the charge pumps 130*a* and 130*b* to optimally correspond to the data recording speed. In other words, the control circuit 186 sets the drive capacities in optimal correspondence with the data recording speed (linear velocity related to the rotation of the optical disc 1). The setting of the drive capacities of the charge pumps 130*a* and 130*b* with the control circuit 186 is performed by providing a command signal to the gain switching circuit 131*a* of FIG. 8 or a corresponding circuit. During the adjustment of the drive capacity, it is preferred that the drive capacity be increased as the data recording speed increases.

In accordance with the mode signal, the control circuit 186 generates a command signal, which is provided to the decoder 184*d* of the voltage generation circuit 184. Further, the control circuit 186 switches the switching circuit 185 to apply the DC voltage of the voltage generation circuit 184 to the low pass filter 170 and inactivates the charge pump 160. In other words, the control circuit 186 does not apply an enable signal to all of the charge pump units CP to inactivate the charge pump 160. This completes the initial setting with the clock generator 100.

Subsequent to the initial setting, when the clock generator 100 is provided with the wobble signal, the frequencies of the first divisional clock signal and the wobble signal are synchronized in the first loop A. In this state, the charge pump 160 in the second loop B is inactivated. The DC voltage of the voltage generation circuit 184, or a constant voltage, is applied to the second control voltage input terminal INb of the VCO 110. At this point, the second loop B performs open loop control.

In the first loop A, when the first monitor circuit 180 detects that the difference between the frequencies of the first divisional clock signal and the wobble signal are converged within a predetermined range, the control circuit 186 switches the second loop B to closed loop control. That is, the control circuit 186 inactivates a predetermined number of charge pump units CP in the charge pump 160 and switches the switching circuit 185 so that the voltage of the voltage generation circuit 184 is not applied to the low pass filter 170. This applies a voltage, which corresponds to the difference between the phases of the second divisional clock signal and the LPP signal, to the second control voltage input terminal INb of the VCO 110.

Further, the control circuit 186 lowers the drive capacities of the charge pumps 130a and 130b. This causes the load on the first loop A to be less than the load on the second loop B after the difference between the frequencies of the wobble signal and the first divisional signal becomes small. Thus, the second loop B is hardly affected by the first loop A, and the second loop B properly performs fine adjustment of the clock signal.

When the first loop A is performing the rough adjustment, the voltage generation circuit 184 applies a constant (DC) voltage on the second control voltage input terminal INb of the VCO 110. This smoothly switches the second loop B to fine adjustment. That is, when the charge pump 160 is switched from an inactivated state to an activated state, the oscillation frequency is prevented from suddenly fluctuating due to sudden changes in the value of the voltage applied to the second control voltage input terminal INb of the VCO 110.

It is preferred that the DC voltage supplied to the second control voltage input terminal INb from the voltage generation circuit 184 be about the same as the voltage applied to the second control voltage input terminal INb when the second loop B synchronizes the phases of the second divisional clock signal and the LPP signal. This prevents the value of the DC voltage from suddenly fluctuating when the charge pump 160 is activated. It is preferred that the value of the DC voltage be a median value between maximum and minimum values of the voltage applied to the second control voltage input terminal INb.

The VCO 110 of the preferred embodiment has the advantages described below.

(1) The first and second current sources 112 and 114 of the VCO each have the output current channels, which are connected in parallel to one another, and selectively activates the output current channels to vary the changing amount of the output current relative to changes in the first and second control voltages Va and Vb. Thus, optimal gain adjustment is easily performed even when adjusting the gain of the VCO 110 with the two control voltages Va and Vb.

(2) The VCO 110 includes the first and second current sources 112 and 114 to adjust the gain of the VCO 110 by varying the changing amount of the output current relative to changes in the first and second control voltages Va and Vb. Thus, the characteristics of the VCO 110 is optimally varied in accordance with the rotation velocity of the optical disc 1.

It should be apparent to those skilled in the art that the present invention may be embodied in many other specific forms without departing from the spirit or scope of the invention. Particularly, it should be understood that the present invention may be embodied in the following forms.

The first current source 112 may be replaced if necessary as long as the changing amount of the first control current relative to the changing amount of the first control voltage Va is enabled.

The second current source 114 may be replaced if necessary as long as the changing amount of the second control current relative to the changing amount of the second control voltage Vb is enabled.

The control voltage generation circuit 116 may be replaced if necessary as long as the control voltage of the ring oscillator 118 is generated in accordance with the synthesized current of the first and second control currents.

The ring oscillator 118 may include a delay circuit, which delaying amount is varied in accordance with the amount of supplied current. In this case, an odd number of inverters may be arranged at the input side or output side of the delay circuit.

The present examples and embodiments are to be considered as illustrative and not restrictive, and the invention is not to be limited to the details given herein, but may be modified within the scope and equivalence of the appended claims.

What is claimed is:

1. A voltage-controlled oscillator for generating an oscillation signal with a frequency corresponding to first and second control voltages, the voltage-controlled oscillator comprising:

a first current source for generating a first control current in accordance with the first control voltage, with the first current source varying a changing amount of the first control current relative to a change in the first control voltage;

a second current source for generating a second control current in accordance with the second control voltage, with the second current source varying a changing amount of the second control current relative to a change in the second control voltage;

a control voltage generation circuit connected to the first and second current sources to synthesize a synthesized current from the first and second control currents and generate an oscillation control voltage in accordance with the synthesized current; and a ring oscillator connected to the control voltage generation circuit to generate the oscillation signal with a frequency corresponding to the oscillation control voltage.

2. The voltage-controlled oscillator according to claim 1, wherein the first current source includes:

a first input current circuit for generating current in accordance with the first control voltage;

a plurality of first output current channels current mirror-connected and parallel-connected to the first input current circuit; and a plurality of first switches, each being series-connected to an associated one of the first output current channels, with the first current source varying the changing amount of the first control current relative to a change in the first control voltage by selectively opening and closing the plurality of first switches; and the second current source includes:

a second input current circuit for generating current in accordance with the second control voltage;

a plurality of second output current channels current mirror-connected and parallel-connected to the second input current circuit; and a plurality of second switches, each being series-connected to an associated one of the second output current channels, with the second current source varying the changing amount of the second control current relative to a change in the second control voltage by selectively opening and closing the plurality of second switches.

3. The voltage-controlled oscillator according to claim 2, further comprising:

a control circuit connected to the first and second current sources to selectively open and close the plurality of first and second switches.

4. A voltage-controlled oscillator for generating an oscillation signal with a frequency corresponding to a plurality of control voltages, the voltage-controlled oscillator comprising:

a plurality of current sources, each generating a control current in accordance with an associated one of the control voltages, each current source varying a changing amount of its respective control current relative to a change in the associated control voltage;

a control voltage generation circuit connected to the plurality of current sources to synthesize a synthesized current from the control currents and generate an oscillation control voltage in accordance with the synthesized current; and a ring oscillator connected to the control voltage generation circuit to generate the oscillation signal with a frequency corresponding to the oscillation control voltage.

5. The voltage-controlled oscillator according to claim 4, wherein each current source includes:

an input current circuit for generating current in accordance with the associated control voltage;

a plurality of output current channels current mirror-connected and parallel-connected to the input current circuit; and a plurality of switches, each being series-connected to an associated one of the output current channels;

each current source varying a changing amount of the control current relative to a change in the associated control voltage by selectively opening and closing the plurality of switches.

6. The voltage-controlled oscillator according to claim 5, further comprising:

a control circuit connected to the current sources to selectively open and close the plurality of switches of each current source.

7. A method for controlling a voltage-controlled oscillator that generates an oscillation signal with a frequency corresponding to first and second control voltages, the method comprising:

generating a first control current in accordance with the first control voltage by supplying the voltage-controlled oscillator with the first control voltage;

varying a changing amount of the first control current relative to a change in the first control voltage;

generating a second control current in accordance with the second control voltage by supplying the voltage-controlled oscillator with the second control voltage;

varying a changing amount of the second control current relative to a change in the second control voltage;

synthesizing a synthesized current from the first and second control currents to generate an oscillation control voltage in accordance with the synthesized current; and generating the oscillation signal with a frequency corresponding to the oscillation control voltage.

8. The method according to claim 7, wherein:

the voltage-controlled oscillator includes a first current source having a plurality of first output current channels and a second current source having a plurality of second output current channels;

said varying a changing amount of the first control current includes selectively connecting in parallel the first output current channels; and said varying a changing amount of the second control current includes selectively connecting in parallel the second output current channels.

* * * * *

UNITED STATES PATENT AND TRADEMARK OFFICE
CERTIFICATE OF CORRECTION

PATENT NO. : 6,992,536 B2  
DATED : January 31, 2006  
INVENTOR(S) : Masashi Kiyose and Takuya Shiraishi It is certified that error appears in the above-identified patent and that said Letters Patent is hereby corrected as shown below:

<u>Title page,</u>  
Insert Item -- [30] Foreign Application Priority Data  
        Aug. 2, 2002    [JP] Japan ............... 2002-226742  
        May 30, 2003   [JP] Japan ............... 2003-153873 --.

Signed and Sealed this

Twenty-fifth Day of April, 2006

JON W. DUDAS  
*Director of the United States Patent and Trademark Office*